United States Patent [19]
Murakami

[11] Patent Number: 5,902,138
[45] Date of Patent: May 11, 1999

[54] BRANCH JUNCTION BOX

[75] Inventor: Koji Murakami, Yokkaichi, Japan

[73] Assignee: Sumitomo Wiring Systems, Ltd., Japan

[21] Appl. No.: 08/599,953

[22] Filed: Feb. 14, 1996

[30] Foreign Application Priority Data

Feb. 14, 1995 [JP] Japan .................................. 7-025281

[51] Int. Cl.⁶ .................................................. H01R 9/09
[52] U.S. Cl. .......................................................... 439/76.2
[58] Field of Search ........................... 439/77, 76.1, 76.2

[56] References Cited

U.S. PATENT DOCUMENTS

| | | |
|---|---|---|
| 4,603,930 | 8/1986 | Ito . |
| 4,689,718 | 8/1987 | Maue et al. ...................... 439/76.2 X |
| 4,858,071 | 8/1989 | Manabe et al. . |
| 4,944,684 | 7/1990 | Leibowitz ........................ 439/444 X |
| 4,959,018 | 9/1990 | Yamamoto et al. ............ 439/76.1 OR |
| 5,067,905 | 11/1991 | Matsumoto et al. ............ 439/76.2 OR |
| 5,249,973 | 10/1993 | Fujita et al. . |

FOREIGN PATENT DOCUMENTS 1202109   8/1989   Japan .

Primary Examiner—Neil Abrams
Assistant Examiner—Daniel Wittels
Attorney, Agent, or Firm—Jordan B. Bierman; Bierman, Muserlian and Lucas

[57] ABSTRACT

A branch junction box containing a flexible printed circuit sheet includes circuit terminals and other parts which are easily mounted. A first insulation plate is provided on one of its faces, with a plurality of printed circuit terminals vertically fixed therethrough. On its other face, the first insulation plate carries a flexible printed circuit sheet, the printed circuit of which is electrically connected to the circuit terminals. The surface of the insulating plate facing the circuit terminals may be provided with bus bar wiring patterns and corresponding bus bar terminals. These circuit terminals and bus bar terminals are branch-connected to wiring harnesses in a proper and reliable way through connectors formed in the casing of the box.

15 Claims, 6 Drawing Sheets

5,902,138

BRANCH JUNCTION BOX

This Application claims the priority of Japanese Application 7-25281, filed Feb. 14, 1995.

The present Invention relates to electrical wiring for vehicles; more particularly, it is directed to an interconnection system for branching and connecting wiring harnesses, and a branch junction box implementing such a system.

BACKGROUND OF THE INVENTION

A branch junction connector can be based on a bus bar wiring system through which wiring harness terminals are interconnected. To this end, the bus bar wiring is formed by cutting thin bent metallic sheets into narrow strips. Other connecting systems are based on printed circuit boards on which wiring is added in the form of copper layers. Branch junction boxes comprising the aforementioned bus bar wiring system can withstand strong electric currents. However, the cutting and forming of the thin metallic sheets is labor intensive and the approach is not amenable to a speeding up the assembly of the junction box.

On the other hand, in the branch junction box comprising the print circuit, it is relatively easy to form the circuit wiring system and miniaturization is possible. However, the printed wire circuit cannot withstand high currents.

As a way of solving the above-mentioned problem, a branch junction box has been described in JP-A-1 202 109. When configured for connecting terminals, the branch junction box combines a bus bar wiring system with high current capacity connections and a sheet wiring system using a flexible printed circuit (FPC) for weak and moderate currents. In this way, means are provided for accommodating the large currents whilst enabling the dimensions of the box to remain reasonably small.

In branch junction boxes comprising FPC sheet wiring systems, connecting terminals are formed by reinforcing FPC terminals that are integrally formed by the FPC sheet. FIG. 9 shows an example of such a connecting terminal, wherein connector housing 10 on branch junction box 11 is integrally provided with reinforcing wall 12, the latter then being covered with FPC terminal 13.

FIG. 10 shows another example of a connecting terminal in which protruding portion 14 is provided at an internal face of connector housing 10, while FPC terminal 13 is provided with hole 13a for receiving the protruding portion. Thus, FPC terminal 13 is fixed by engagement of protruding portion 14 by hole 13a.

As shown in FIGS. 9 and 10, connecting terminal 15 of a wiring harness is formed by elastically bending a narrow metallic band along part of its length. This terminal 15 is inserted into connector housing 10 and connected to a connecting terminal therein.

However, the FPC sheet in such a known branching junction box 11 is thin and easily bent, so that it is difficult to secure it reliably in branch junction box 11. Moreover, when box 11 is composed of a lower case and an upper case (not shown in figures), the FPC sheet may be nipped between the two when they are assembled, with the risk of cutting off a portion of the sheet wiring.

Moreover, FPC terminal 13, being integral with an FPC sheet, has to be thin and soft. This makes it difficult to work the terminal through and insert it securely into connector housing 10. Further, the electrical connection between FPC terminal 13 on the side of branch junction box 11 and connecting terminal 15 on the side of the wiring harness requires a certain amount of resilience. In such a structure, when branch junction box 11 is deformed by heat, such as is generated within a vehicle, especially at the level of connector housing 10, proper electrical contact may no longer be ensured between FPC terminal 13 and connecting terminal 15.

It is, therefore, an object of the present Invention to solve each of the above-mentioned problems by providing an interconnecting system for wiring harnesses and a branch junction box containing the latter, in which a thin and foldable FPC sheet is easily fixed without being impaired and in which connecting terminals are easily installed, thereby enabling proper electric contact with a wiring harness.

SUMMARY OF THE INVENTION

To solve the above-mentioned problems, there is provided an interconnection system for connecting wiring harnesses, comprising at least one flexible sheet carrying a printed circuit and a plurality of electrical circuit terminals to be connected to the wiring harnesses, and at least one insulating plate facing the flexible sheet.

The insulating plate is secured to the flexible sheet, and the insulating plate and the flexible sheet are provided with a plurality of first path holes substantially perpendicular thereto. The circuit terminals fit through the path holes, so that the first end of the terminals is electrically connected to the printed circuits, and wherein the terminals are mechanically fixed to the insulating plate. As a result, the second end of the terminals, opposite the first end, is adapted to be connected to the wiring harnesses.

The circuit terminals may advantageously comprise a head of comparatively large diameter and a leg of comparatively small diameter. The path holes of the insulating plate define a stepped profile, corresponding to the head shape on the first face of the insulating plate and the leg shape on the second face thereof. The second face is opposite the first face and faces the flexible sheet; the terminals are received in the path holes and the leg part is fixed on the printed circuit by means of an electrically conducting material. It is also possible to provide the circuit terminals with a flange on the head, so that the latter is supported externally.

The insulating plate can be provided with bus bar wiring patterns on the first face, the patterns being provided with a plurality of bus bar terminals projecting substantially perpendicularly therefrom. The insulating plate and flexible sheet can further be provided with second path holes, whereby a group of bus bar terminals pass through the second holes and project substantially perpendicularly from the second face.

Preferably, the insulating plate is provided with protruding elements on at least one face thereof, whereupon the flexible sheet and/or the bus bar wiring patterns are provided with path holes at positions corresponding to the protruding elements. The sheet and/or patterns are then fixed to the insulating plate by fitting the protruding elements into the holes.

A second insulating plate may be provided on the bus bar wiring patterns of the insulating plate. The second plate can carry at least either a flexible sheet or bus bar wiring patterns with corresponding circuit or bus bar terminals. It can further be provided with path holes, through which the circuit and bus bar terminals of the first insulating plate pass and project outwardly. At least one face of the first insulating plate can be provided with a device for holding electronic components.

The Invention also includes a branch junction box containing the above interconnection system. The box comprises an upper case and a lower case, the upper case comprising connector housings for receiving the circuit and/or bus bar terminals and the lower case comprising path holes for other bus bar terminals for external connection.

BRIEF DESCRIPTION OF THE DRAWINGS

The above and other objects, features and advantages of the Invention will be made apparent from the following description of the preferred embodiments, given as non-limiting examples, with reference to the accompanying drawings, in which.

DETAILED DESCRIPTION OF THE PREFERRED EMBODIMENTS

Figure 1:
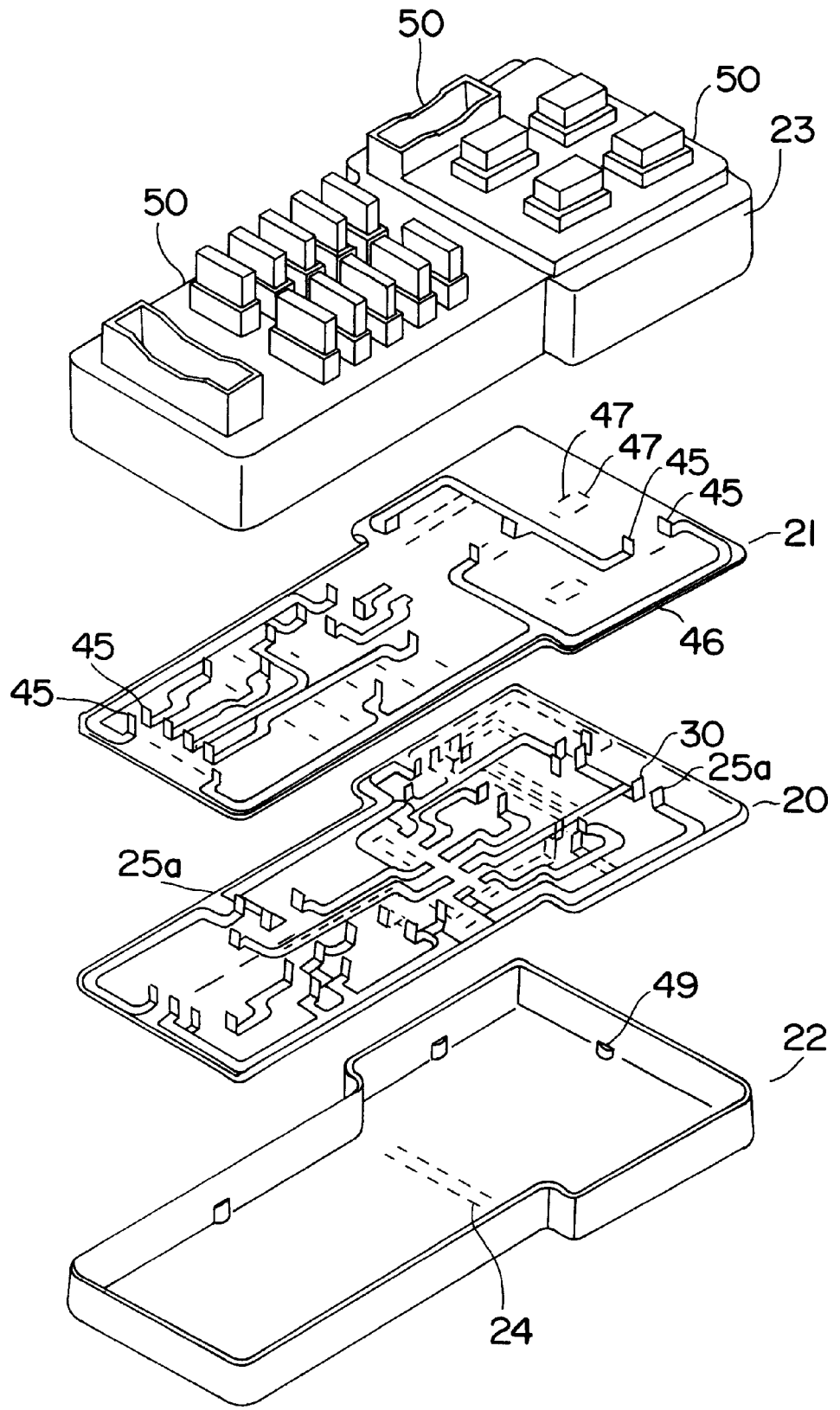
FIG. 1 is an exploded perspective view of a branch junction box according to the present Invention.
Figure 2:
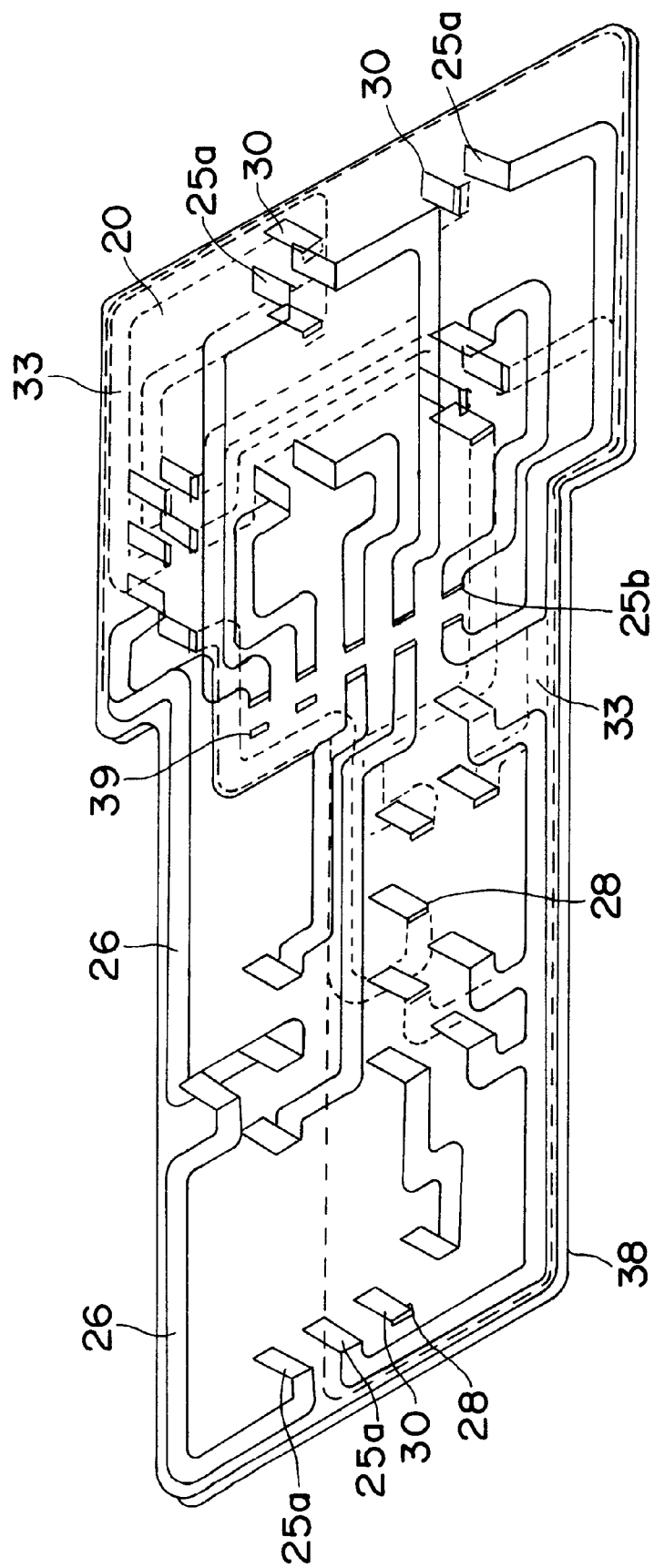
FIG. 2 is a perspective view of the first insulating plate according to the present Invention.

Referring to FIGS. 1 and 2, first and second insulating plates 20 and 21 are both made of insulating resin and have a thickness suitable for pressing and fixing terminals thereinto. They may usefully be 2 to 5 mm thick, comparatively thicker than known insulating plates, which are generally 1 to 2 mm thick. These plates are accommodated in a two-part case comprised of lower and upper cases 22 and 23. Second insulating plate 21 is stacked on the upper face of first insulating plate 20. The upper face of first insulating plate 20 is provided with first bus bar terminals 25a projecting upwardly at positions corresponding to connector housings 50 formed in upper case 23.

First bus bar terminals 25b (FIG. 2) are also provided projecting downwardly from first insulating plate 20 at positions corresponding to holes 24 formed in lower case 22. These bus bar terminals 25b provide external connections at lower case 22. First bus bar terminals 25a and 25b are electrically connected to first bus bar wiring patterns 26.

First bus bar wiring patterns 26 are integrally formed from metallic strips shaped to define a path along the plate and bent at one or both ends to form terminals 25a and 25b. The upper face of first insulating plate 20 may also be provided with circuit terminals 30 at positions corresponding to connector housings 50 in upper case 23.

Figure 3:
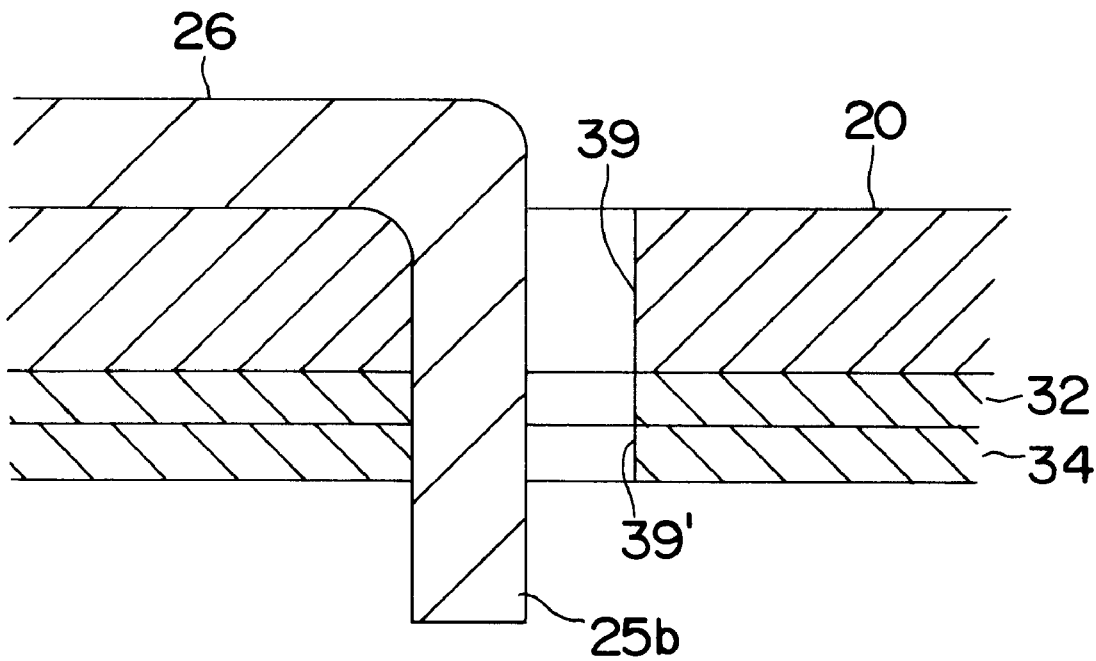
FIG. 3 is a sectional view of a first bus bar wiring pattern according to the present Invention.
Figure 4:
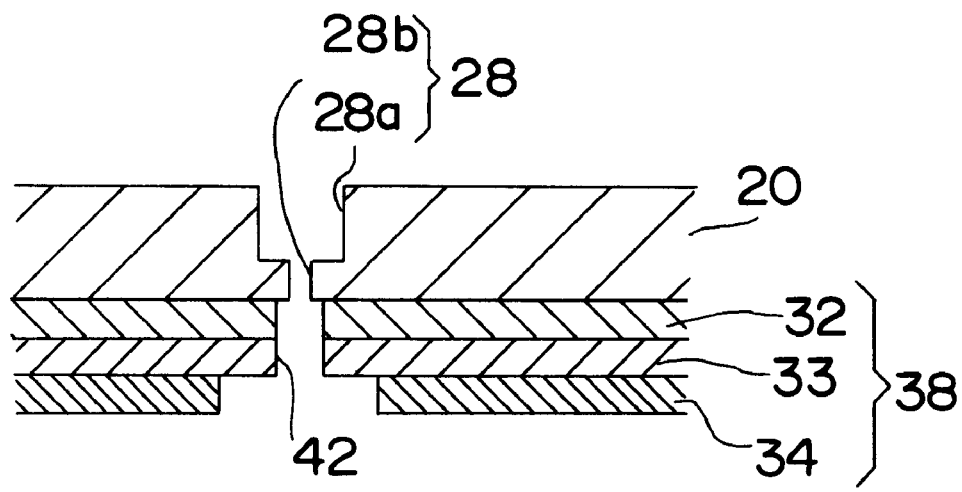
FIG. 4 is a sectional view of a superposed first insulating plate and flexible printed circuit sheet, showing a through hole for fitting a circuit terminal.
Figure 5:
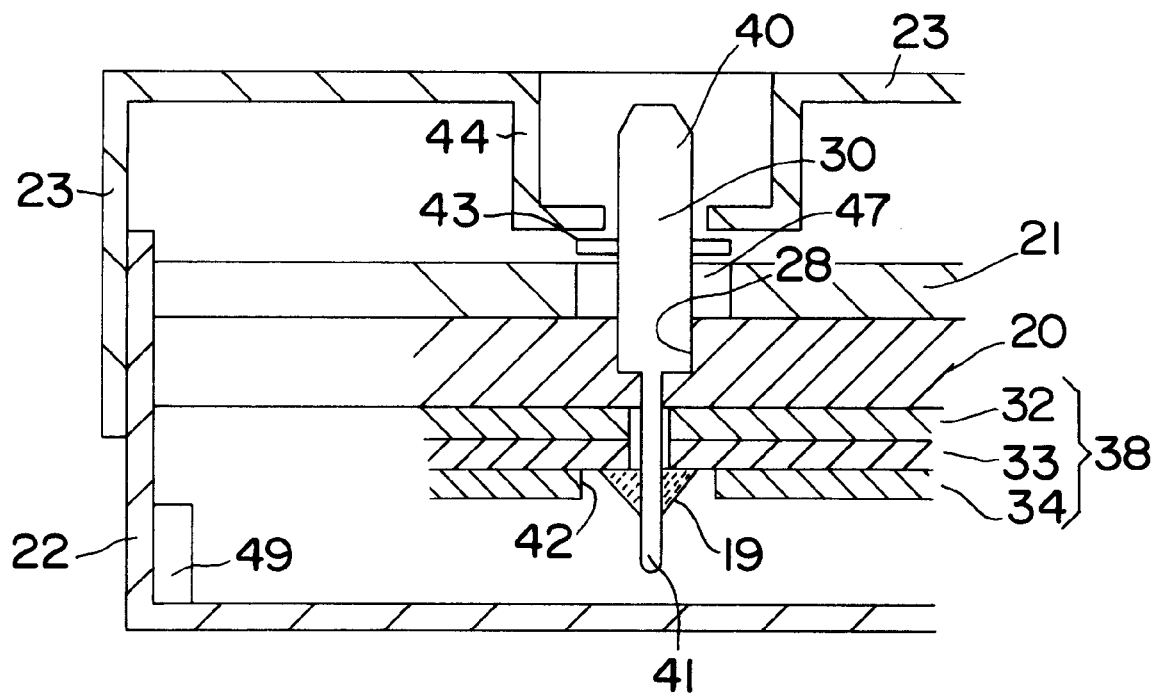
FIG. 5 is a partial cross-sectional view of a branch junction box according to the Invention equipped with first and second insulating plates.

As shown in FIG. 2 (dotted lines) and in FIGS. 3 to 5, the lower face of first insulating plate 20 is provided with flexible printed circuit sheet 38. The latter comprises insulating film 32 of about 12 to 250 μm thickness, preferably about 125 μm, of polyester, polyimide, or the like. It also includes underlying printed circuit 33 of about 18 to 200 μm thickness, preferably around 70 μm, of copper plate, and cover film 34 of about 12 to 125 μm thickness.

First insulating plate 20 is therefore thicker than flexible printed circuit sheet 38 and relatively rigid so as to form a mechanical support therefor. As shown in FIG. 3, downwardly projecting first bus bar terminals 25b pass through holes 39 in first insulating plate 20 and through holes 39' in flexible sheet 38.

FIGS. 4 and 5 show a method for fixing printed circuit terminal 30 of FIG. 2 to first insulating plate 20. For this purpose, through-holes 28 in first insulating plate 20 are at positions from which circuit terminals 30 project. Opening 28a at the upper face is relatively large and opening 28b at the lower face is relatively small. Thus, holes 28 define a stepped profile as seen in a cross section through the thickness of insulating plate 20. Flexible printed circuit board 38 is provided with through-holes 42 at positions corresponding to hole portion 28, so that circuit wiring 33 is exposed due to discontinuities in cover film 34.

Then, as shown in FIG. 5, circuit terminal 30, composed of head 40 and leg 41, is press fitted into hole 28 and vertically aligned. Head part 40 projects upwardly, and leg 41 projects downwardly, from insulating plate 20. Hole 28 is designed so that circuit terminal 30 is fixed securely to insulating plate 20.

Leg 41 projecting through hole 42 is connected to printed circuits 33 as by soldered joints 19, so that circuit terminals 30 are electrically connected to one another. Head 40 is provided with flange 43 which cooperates with a bottom surface of upper case 23, so that, after being covered thereby, circuit terminal 30 is reinforced against traction exerted by the harness. To this end, the bottom surface of upper case 23 may be provided with downwardly extending sections 44 which abut flange 43.

If second insulating plate 21 is to be placed over first insulating plate 20, holes 47 therein are larger than flange 43, which can then pass through its corresponding hole 47 as shown in FIG. 5. However, cooperation between sections 44 of upper casing 23 and flanges 43 of corresponding circuit terminal 30 is not specific to the embodiment based on first and second insulating plates 20 and 21, but can be applied to embodiments based on just first insulating plate 20 or any other embodiment of the Invention.

Figure 6:
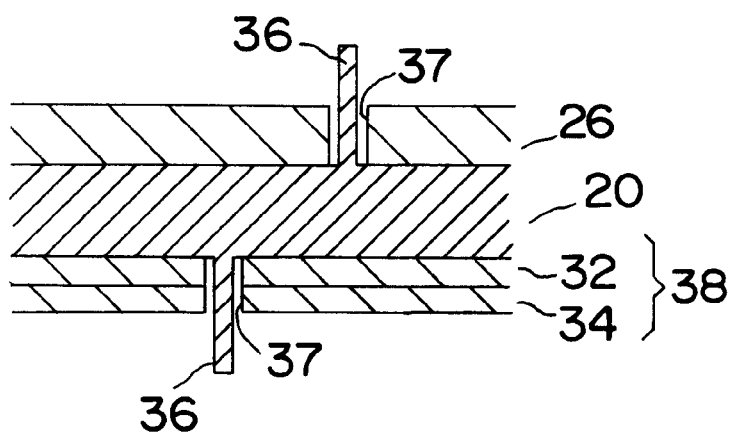
FIG. 6 is a sectional view of the first insulating plate with protruding parts, equipped with a flexible printed circuit sheet and a bus bar wiring pattern.
Figure 7:
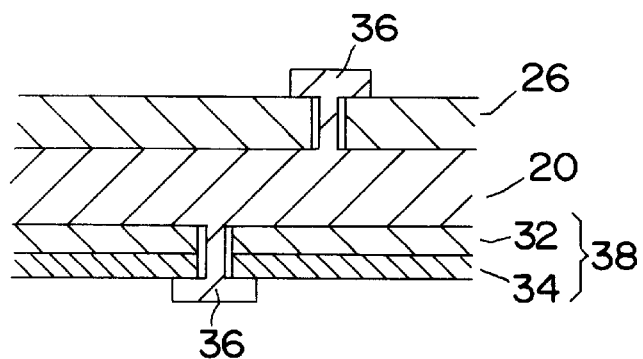
FIG. 7 is a sectional view as in FIG. 6 above, showing a fixed state by the protruding parts.

First flexible sheet 38 and first bus bar wiring patterns 26 are fixed to plate 20 as shown in FIGS. 6 and 7. Plate 20 is integrally provided, on both its faces, with protruding elements 36. The sections of flexible sheet 38 not equipped with printed circuits 33 and first bus bar wiring patterns 26 are provided with path holes 37 at positions corresponding to protruding elements 36, so that the latter can be fitted therein. The heads of protruding elements 36 are soldered or brazed onto first wiring patterns 26 and flexible sheet 38 (FIG. 7). In this way, flexible sheet 38 and wiring patterns 26 are easily and firmly fixed to plate 20.

Second insulating plate 21 is provided with path holes 47 that receive first bus bar terminals 25a and circuit terminals 30 of first insulating plate 20. When first and the second insulating plates 20 and 21 are stacked, circuit terminals 30 and bus bar terminals 25a pass through holes 37 and 47 and protrude upwardly from second insulating plate 21.

As shown in FIG. 1, second insulating plate 21 may be provided, on its upper face, with second bus bar terminals 45 and second bus bar wiring patterns 46 in the same way as first bus bar terminals 25a and bus bar wiring patterns 26 on the upper face of first plate 20. First and second insulating plates 20 and 21 are stacked in lower case 22 and held in place by supporting latch 49 provided therein. They are then covered by upper case 23 to form the branch junction box.

Circuit terminals 30, first bus bar terminals 25a, and second bus bar terminals 45 are accessible through connector housings 50 on upper case 23, and thereby serve as connectors for contact with a wire harness. First bus bar terminals 25b pass through holes 24 in lower case 22 and project downwardly therefrom, thereby providing a connection for first bus bar wiring patterns 26 to additional external connectors (not shown).

In accordance with the present branch junction box, circuit terminals 30 are pressed into first insulating plate 20 and vertically fixed. Therefore, it is not necessary, as in the past, to form a flexible printed circuit terminal by transforming a thin and difficult-to-work flexible sheet. Accordingly, assembly is simplified and the structure possesses greater solidity. Also, the quality of the electrical contact does not depend on the resilience of the connecting terminal of the wiring harness. Thus, even when upper and lower cases 22 and 23 are deformed by heat, electrical contact with the wiring harness will not be impaired, and proper contact is still ensured.

Also, because flexible sheet 38 is fixed along the lower face of first plate 20, it is easily fitted into the branch junction box without being damaged when being assembled. Further, printed circuits 33, first bus bar wiring patterns 26, and second bus bar wiring patterns 46 may be amalgamated so that a wire harness for large electric current is branch-connected with first and second bus bar wiring patterns 26 and 46, while a wire harness for small electric current is branch-connected with printed circuits 33. In this way, the wire harnesses for both large and small currents are efficiently branch-wired in a small branch junction box.

Figure 8:
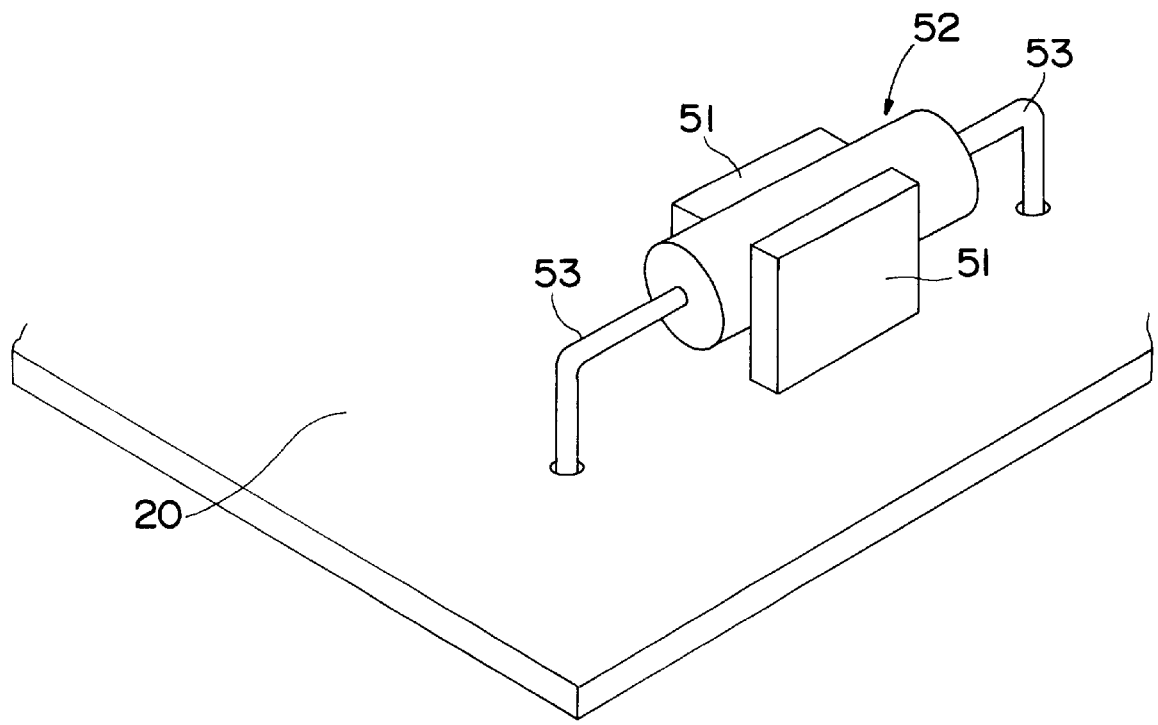
FIG. 8 is a perspective view of the fixing means assembled on one side of the insulating plate.
Figure 9:
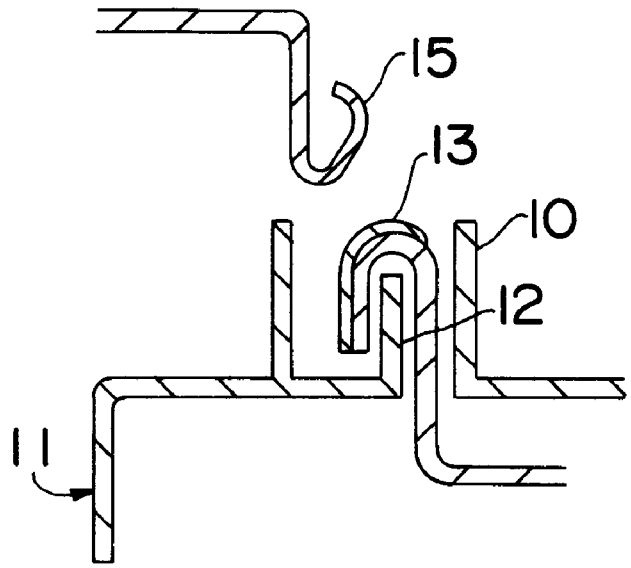
FIG. 9 is a sectional view of a known connecting terminal.
Figure 10:
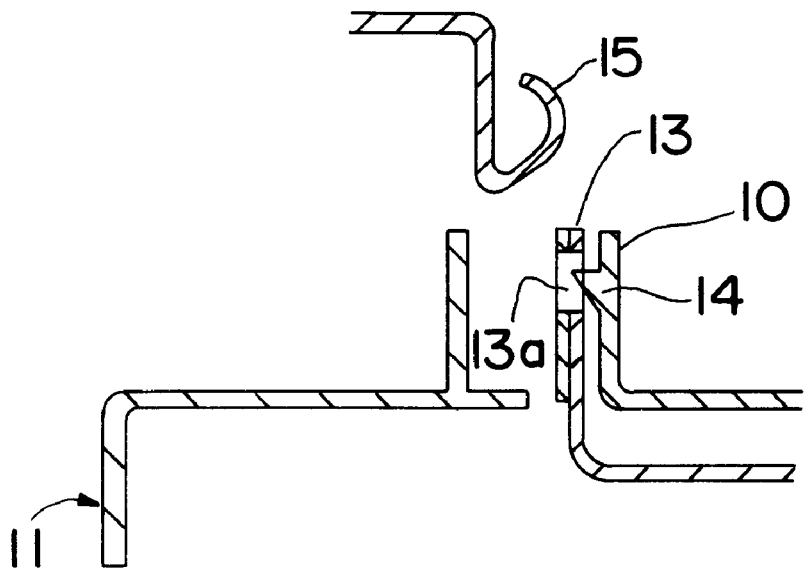
FIG. 10 is a sectional view of another known connecting terminal.

As shown in FIG. 8, first insulating plate 20 may be provided, on its upper face, with a pair of fixing members 51 for mounting electronic component 52. In this case, electronic component 52 is first put into place, and then end 53 of component 52 is fixed to first bus bar wiring patterns 26 or printed circuits 33 by soldering. Thus, electronic component 52 is conveniently and easily mounted. When electronic component 52 is fixed on first insulating plate 20, its handling may be easily mechanically automated, thereby improving productivity.

Second insulating plate 21 may be stacked with a plurality of further layers, so that more wire harnesses are branch-wired. Conversely, first insulating plate 20 alone, without second insulating plate 21, may suffice in some applications. Further, circuit terminal 30 may be of any shape that can be pressed into insulating plate 20, such as a thin rod-type pin or the like. These and other changes may be made without departing from the scope or spirit of the present Invention, which is to be broadly construed and not to be limited except by the character of the claims appended hereto.

What we claim is:

1. A system for connecting wiring harnesses comprising
   a first flexible sheet including a printed circuit thereon, a plurality of first circuit terminals for connection to said wiring harnesses, each of said first circuit terminals having a first end and a second end, a first insulating plate having a first surface facing said sheet, a second surface on said first insulating plate opposite said first surface;
   a retainer for securing said sheet to said first insulating plate comprising a plurality of first path holes extending through said first insulating plate and said sheet in a direction substantially perpendicular to a plane of said first plate and said sheet, each of said first circuit terminals extending through one of said first path holes;
   a connection between said first end and said printed circuit, said second end adapted for connection to one of said wiring harnesses;
   a first bus bar wiring pattern on said second surface, said first pattern having at least one first bus bar terminal which projects from said second surface.

2. The system of claim 1 wherein said first insulating plate and said sheet are provided with a plurality of second path holes extending therethrough in a direction substantially perpendicular thereto, said first bus bar terminal passing through one of said second path holes and projecting from said first surface.

3. The system of claim 2 wherein said first bus bar terminal projects substantially perpendicularly from said first surface.

4. The system of claim 1 wherein said first insulating plate carries a protruding element on at least one of said first surface and said second surface, at least one of said first sheet and said first bus bar pattern has a hole corresponding to said protruding elements, said elements fitted into said hole, thereby fixing said first sheet and/or said first bus bar pattern to said first insulating plate.

5. The system of claim 1 wherein at least one of said first surface and said second surface is provided with a fixing device for holding electronic components.

6. The system of claim 1 wherein at least one of said first surface and said second surface is provided with a fixing device for holding electronic components.

7. The system of claim 1 wherein said first bus bar terminal projects substantially perpendicularly from said second surface.

8. A branch junction box having an upper case, a lower case, and the system of claim 1 therebetween, said upper case having connector housings for receiving said first circuit terminals.

9. A branch junction box having an upper case, a lower case, and the system of claim 1 therebetween, said upper case having connector housings for receiving said first circuit terminals and said first bus bar terminals, said lower case comprising holes for receiving additional bus bar terminals for external connection.

10. A system for connecting wiring harnesses comprising
    a first sheet including a printed circuit thereon, a plurality of first circuit terminals for connection to said wiring harnesses, each of said first circuit terminals having a first end and a second end, a first insulating plate having a first surface facing said sheet, a second surface on said first insulating plate opposite said first surface;
    a retainer for securing said sheet to said first insulating plate comprising a plurality of first path holes extending through said first insulating plate and said sheet in a direction substantially perpendicular to a plane of said first plate and said sheet, each of said first circuit terminals extending through one of said first path holes;
    a connection between said first end and said printed circuit, said second end adapted for connection to one of said wiring harnesses;
    each of said first circuit terminals has a head end and a leg end, said head end having a larger diameter than said leg end, each of said first path holes having a stepped axial cross section complementary to one of said first circuit terminals.

11. The system of claim 10 wherein each of said first path holes has a head portion adjacent said first surface and a leg portion adjacent said second surface.

12. The system of claim 11 wherein said leg end is in electrical contact with said printed circuit.

13. The system of claim 12 wherein said leg end is affixed to said printed circuit by electrically conductive material.

14. The system of claim 10 wherein each of said first circuit terminals has a flange on said head end, said flange being substantially parallel to said plane, whereby said head end is supported.

15. A system for connecting wiring harnesses comprising a first sheet including a printed circuit thereon, a plurality of first circuit terminals for connection to said wiring harnesses, each of said first circuit terminals having a first end and a second end, a first insulating plate having a first surface facing said sheet, a second surface on said first insulating plate opposite said first surface;

a retainer for securing said sheet to said first insulating plate comprising a plurality of first path holes extending through said first insulating plate and said sheet in a direction substantially perpendicular to a plane of said first plate and said sheet, each of said first circuit terminals extending through one of said first path holes;

a connection between said first end and said printed circuit, said second end adapted for connection to one of said wiring harnesses;

a first bus bar wiring pattern on said second surface, said first pattern having at least one first bus bar terminal which projects from said second surface;

a second insulating plate on said first bus bar pattern and carrying a second said sheet, said second sheet being provided with a second bus bar pattern having corresponding second circuit terminals and second bus bar terminals, said second plate having a plurality of third path holes and fourth path holes, said first circuit terminals passing through said third path holes and said first bus bar terminals passing through said fourth path holes, at least one of said first circuit terminals and said first bus bar terminals projecting outwardly of said second insulating plate.

* * * * *